United States Patent [19]

Griffin, Jr.

[11] 4,168,762

[45] Sep. 25, 1979

[54] LOUDSPEAKER ENCLOSURE

[75] Inventor: Timothy L. Griffin, Jr., Shutesbury, Mass.

[73] Assignee: Amanita Sound, Inc., Easthampton, Mass.

[21] Appl. No.: 869,303

[22] Filed: Jan. 13, 1978

[51] Int. Cl.[2] .................... H05K 5/00; G10K 13/00

[52] U.S. Cl. .................... 181/163; 181/148; 181/199

[58] Field of Search .................... 181/163, 199, 148, 156, 181/DIG. 1; 179/1 E

[56] References Cited

U.S. PATENT DOCUMENTS

| | | | |
|---|---|---|---|
| 3,194,340 | 7/1965 | Kuwayama | 181/163 |
| 3,240,289 | 3/1966 | Kishi | 181/199 |
| 3,285,364 | 11/1966 | Cohen | 181/DIG. 1 |
| 3,746,125 | 7/1973 | Hammes | 181/199 |
| 3,882,962 | 5/1975 | Ripple | 181/148 |
| 4,010,821 | 3/1977 | Quillmann | 181/148 |

*Primary Examiner*—Stephen J. Tomsky

*Attorney, Agent, or Firm*—Chapin, Neal & Dempsey

[57] ABSTRACT

A loudspeaker enclosure comprises a shell having an opening therein and a loudspeaker mounting baffle disposed over the opening. The shell is formed entirely from one or more diaphragm members or passive radiators which oscillate in response to selected low frequency sound waves emanating from a loudspeaker mounted within the enclosure. The diaphragms forming the shell reinforce the forward acoustic radiation from the loudspeaker and militate against the formation of standing waves within the enclosure.

8 Claims, 4 Drawing Figures

LOUDSPEAKER ENCLOSURE

BACKGROUND

A cone type loudspeaker radiates energy from both front and rear surfaces of the cone or diaphragm. As the cone moves forward when energized, a pressure area is created at its front surface and a rarefied area is created at its rear surface. This condition is often referred to as an acoustic doublet, two distinct, out of phase wave patterns traveling away from respective sides of the loudspeaker cone. When the loudspeaker is radiating low frequency (50–400 cps) sound, and the two out of phase wave patterns are allowed to interfere with one another, considerable wave cancellation and poor loudspeaker efficiency result.

To militate against such cancellation, a number of loudspeaker mounting arrangements have been proposed. In what is known as an infinite baffle arrangement, the loudspeaker is mounted in a wall or ceiling between two rooms, the wall or ceiling acting as a baffle which totally isolates the sound waves radiated from the front of the loudspeaker cone from those emanating from the rear of the cone. Such an arrangement is, of course, unsuitable where portability of the loudspeaker is required as in sound amplification equipment used by entertainers. Moreover, in such an infinite baffle arrangement, only the sound waves radiating from one of the cone surfaces are directed at a single listener and, therefore, although cancellation is substantially eliminated, this loudspeaker arrangement is still quite inefficient.

To give portability to an infinite baffle arrangement, loudspeakers have been mounted in sealed enclosures having rigid walls, such enclosures being commonly referred to as acoustic suspension enclosures. Such enclosures are little if any more efficient than the infinite baffle arrangements discussed hereinabove in that sound emanating from the rear of the cone is substantially attenuated within the enclosure. Moreover, such acoustic suspension enclosures, due to the rigid construction thereof have certain charactertistic resonant frequencies associated therewith which render the enclosures limited for use with microphones and amplified musical instruments sensitive to outside sound. When such instruments produce musical tones of such resonant frequencies or harmonics thereof, those tones emitted from the enclosure sympathetically interact with the instrument and are thereby exaggerated in level. This condition is known to entertainers and musicians as "resonating". The parallel rigid walls of the acoustic suspension enclosure allow the maintenance of standing waves therebetween. Such standing waves cause the sympathetic acoustic interaction between the enclosure and a nearby musical instrument or microphone described hereinabove, thereby further rendering the enclosure limited for use with microphones and amplified musical instruments sensitive to outside sound.

Although bass-reflex loudspeaker enclosures, those having an open, tuned port in the loudspeaker mounting baffle, afford some measure of reinforcement of forwardly emitted sound waves by rearwardly emitted sound waves, such enclosures include parallel rigid walls which allow standing waves to be maintained therebetween. Such standing wave maintenance, for the reason set forth hereinabove renders the bass reflex enclosure unsuitable for use with microphones and amplified musical instruments sensitive to outside sound.

In an effort to reduce low frequency enclosure resonance, various prior art loudspeaker enclosures such as those disclosed in U.S. Pat. Nos. 2,713,396 to Tavares and 3,667,568 to Liebscher employ flexible diaphragms or passive radiators in one (usually the rear) enclosure wall. Theoretically, such diaphragms should oscillate in response to sound emitted by the loudspeaker thereby reinforcing the sound emitted from the loudspeaker while altering the compliance of the air within the enclosure sufficiently to reduce and even out enclosure resonance. However, such enclosures have not proven popular for the reproduction of sound from musical instruments. This lack of popularity is due to the inability of known passive radiator materials and structures to tolerate the excursions required for the high amplification of music in the entertainment industry. Furthermore, the rigid enclosure walls employed with the passive radiators allow standing waves to maintain themselves within the enclosure thereby causing a sympathetic interaction between the enclosure and neighboring microphones and/or musical instruments sensitive to outside sound as discussed hereinabove.

Accordingly, it is an object of the present invention to provide a loudspeaker enclosure which overcomes the deficiencies of the prior art.

It is another object of the present invention to provide a loudspeaker enclosure wherein sound waves emanating from opposite sides of a loudspeaker cone carries thereby are constructively combined over a broad range of low frequencies.

It is another object of the present invention to provide a loudspeaker enclosure which prevents the formation of standing sound waves within the interior thereof.

It is another object of the present invention to provide an improved loudspeaker enclosure particularly adapted for use with amplified musical instruments.

It is another object of the present invention to provide an improved musical instrument loudspeaker enclosure which is durable in construction.

It is another object of the present invention to provide a musical instrument loudspeaker which may be efficiently and economically produced.

DESCRIPTION OF THE DRAWINGS

These and other objects will become more apparent from the following detailed description taken in connection with the accompanying drawings in which.

DETAILED DESCRIPTION OF THE INVENTION

Figure 1:
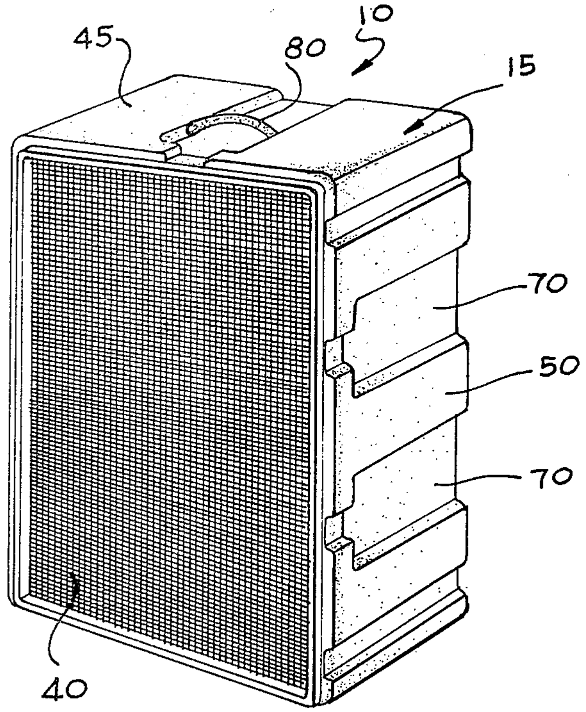
FIG. 1 is a perspective view of the loudspeaker enclosure of the present invention.

Referring to the drawings, the loudspeaker enclosure of the present invention is shown generally at 10 and includes a shell 15 having an opening 20 therein and a loudspeaker mounting baffle 25 disposed over the opening. Mounting board or baffle 25 provides a surface on which one or more loudspeakers such as that shown at 30 are mounted. For the absorption of high frequency sound waves, the interior of the enclosure shell is lined with a convoluted foam 35.

As shown, loudspeaker 30 is of the cone variety which radiates sound waves from opposite sides of a vibratory cone-shaped diaphragm 37. As set forth hereinabove, sound waves radiated from opposite sides of the cone are 180° out of phase with each other and if allowed to combine, substantially cancel each other in the low frequency range (50–400 cps). Baffle 25 serves to acoustically isolate sound waves emitted from the front surface of the cone from those emitted from the rear surface thereof and to this end is formed from a rigid material such as wood or the like of a thickness sufficient to resist vibration in response to energization of loudspeaker 30. The baffle is secured to shell 15 as by fasteners (not shown) of the like. Grill cloth 40 may be provided over the baffle and loudspeaker for enhanced appearance and/or an added measure of protection for the loudspeaker diaphragm.

Figure 2:
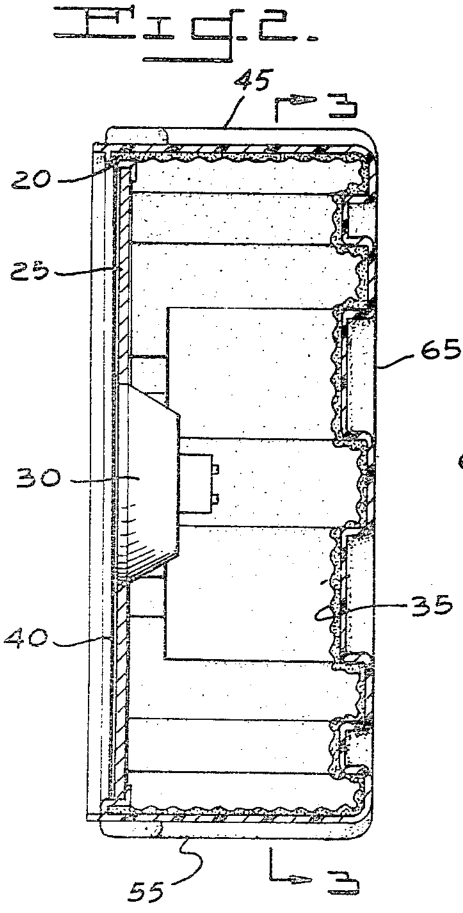
FIG. 2 is a sectional side view of the loudspeaker enclosure of the present invention.
Figure 3:
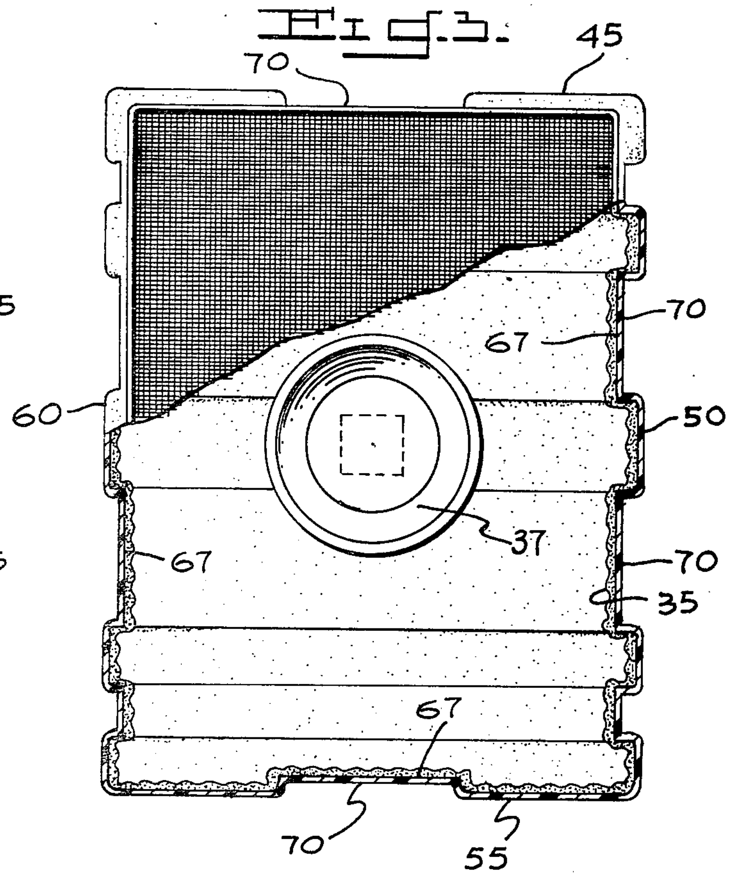
FIG. 3 is a frontal view of the loudspeaker enclosure of the present invention partially broken away and sectioned along line 3—3 of FIG. 2.

Shell 15 comprises side walls 45, 50, 55 and 60 and back wall 65. Each of the walls is a diaphragm member of a flexibility sufficient to render the wall oscillatory in response to sound waves in a selected low frequency range emanating from the rear of the loudspeaker diaphragm. In the preferred embodiment the shell walls are formed from a low density polyethylene of a density of approximately 0.910–0.925 gm./cc and of a thickness of approximately 0.120 to 0.180 in. However, it will be appreciated that other materials of thickness sufficient to respond similarly to the radiation of sound waves in selected frequency ranges from the loudspeaker may be employed without departing from this invention. The walls may be fixed together in any desired manner as by fasteners or the like or by bonding. However, in the preferred embodiment, the walls are formed integrally into the shell, the thickness of the corner portions of the shell being approximately 0.200 in. This integral construction is achieved by means of a rotational molding process which allows the thickness and contour of the walls to be economically and efficiently controlled. As best seen in FIGS. 2 and 3, the shell walls are provided with inwardly depressed, generally planar, diffuser ribs 67 which effect the reflective scattering and dissipation of certain high frequency sound waves impinging thereon and thereby aid convoluted foam lining 35 in the attenuation of such high frequency sound waves within the enclosure. Diffuser ribs 67 also provide a means by which the stiffness of the walls may be precisely controlled to avoid over excursion of the walls and loudspeaker cone and allow the enclosure to be precisely tuned to achieve a particular audio response. Moreover, the depressions 70 defined in the outer wall surfaces by the diffuser ribs provide convenient receptacles for the enclosure handle 80 and other enclosure hardware (not shown)

Figure 4:
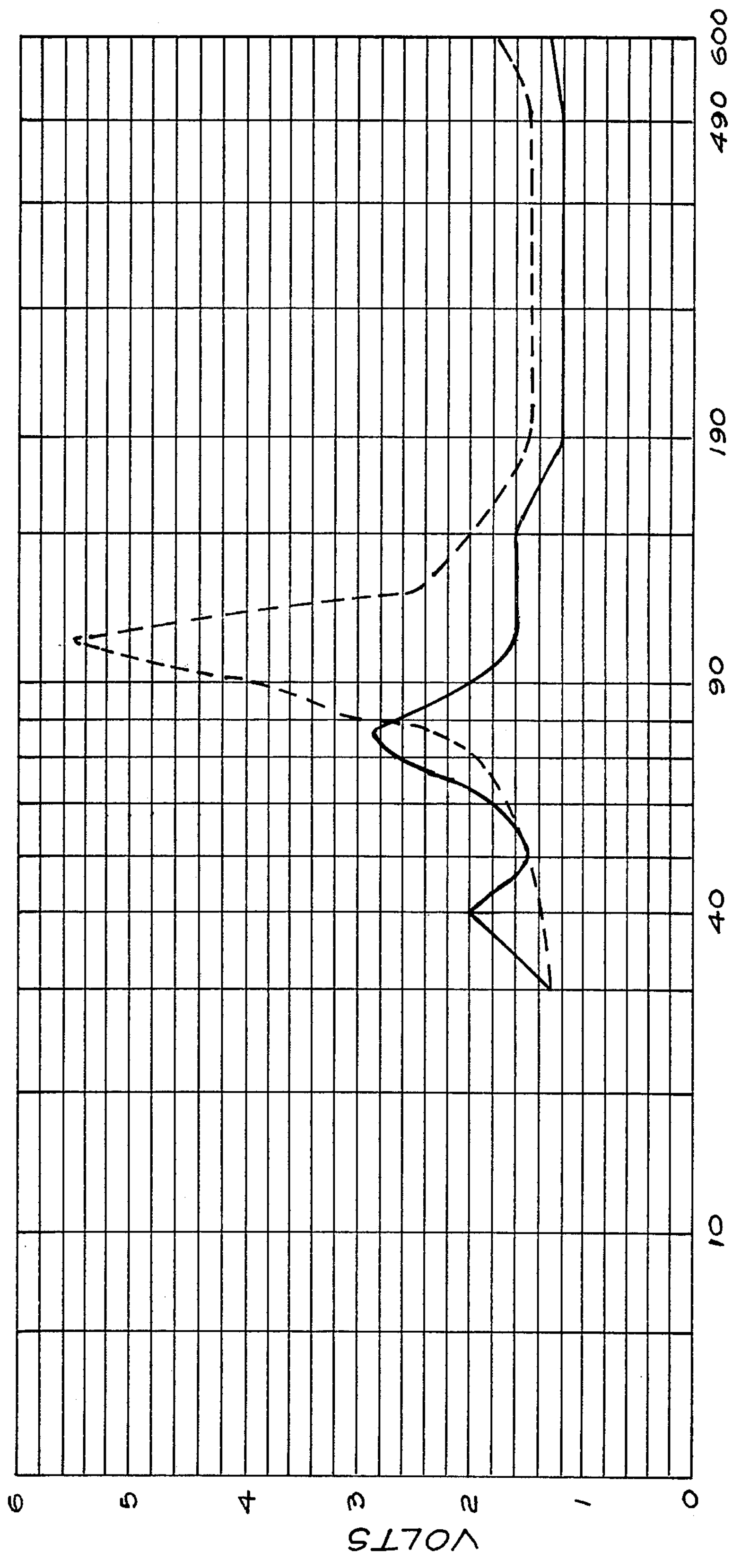
FIG. 4 is a representation of the resonant frequency waves for loudspeaker systems employing a type of prior art enclosure and the enclosure of the present invention.

The enclosure construction of the present invention renders the apparatus ideally suited for musical instrument amplification in, for example, the entertainment industry. By virtue of the structure and composition of the shell walls, sound waves of selected frequency transmitted exteriorly of the loudspeaker enclosure by the oscillatory response of the walls to the loudspeaker undergo a 180° phase shift rendering those waves substantially in phase with the sound waves emanating from the front of the loudspeaker cone. Thus, the shell walls of the enclosure of the present invention exhibit the structural integrity of prior art acoustic suspension enclosures, while providing an enhanced efficiency due to the reinforcement of the forwardly directed sound waves by the vibratory shell walls. Moreover, such structural integrity is achieved without an accompanying increase in the resonant frequency of the enclosure characteristic of prior art acoustic suspension loudspeaker systems. FIG. 4 shows resonant frequency curves for loudspeaker systems employing a prior art wooden acoustic suspension enclosure and the enclosure of the present invention. Both enclosures are of the same geometry, each employing 4 Utah U8 JCW CR loudspeakers. As will be observed, the resonant peak (dashed line) for the prior art wooden enclosure occurred at 100 Hz and was of an amplitude of 5.5 volts measured across the loudspeaker voice coils. However, modification of the compliance of air within the enclosure by the walls of the shell employed in the enclosure of the present invention caused two resonant peaks (solid line) characteristic of this enclosure to occur at substantially lower frequency (40 Hz and 79 Hz) being of much lower amplitude (2 and 2.9 volts). Thus, in loudspeaker systems employing enclosures of the present invention, resonance effects are of lesser magnitude and occur in extremely low frequency ranges thereby rendering the response of the system quite even in that portion of the audible frequency range reproduced by amplified musical instruments.

The flexibility of the shell walls, the absorption of high frequency waves by the convoluted foam, and the high frequency sound wave scattering properties of the diffuser ribs all contribute to a minimization of standing waves within the enclosure. Thus, the acoustic interaction of the loudspeaker enclosure of the present invention with microphones and musical instruments sensitive to outside sound resulting in the hereinabove described "resonating" exaggeration of particular frequencies is substantially reduced. Accordingly, unlike prior art musical instrument loudspeaker systems wherein the back of the enclosure must often be removed to prevent resonating resulting in a rearward loss of sound, the present loudspeaker enclosure minimizes such resonating with enhanced output efficiency.

Furthermore, the low density material employed in the enclosure of the present invention is extremely resistant to shock, yet light in weight rendering the enclosure easily portable and thus ideally suited for professional entertainers.

What is claimed is:

1. A loudspeaker enclosure comprising a shell having an opening therein and a loudspeaker mounting baffle disposed over said opening, said shell being entirely formed from one or more diaphragm members of a stiffness sufficient to maintain the structural integrity of said shell while being oscillatory in response to sound waves of a selected frequency range emanating from a loudspeaker mounted in said baffle, oscillations of said diaphragm members serving to alter the compliance of air in the interior of said enclosure, radiate acoustic energy in said selected frequency range in a phase relationship to reinforce the forward acoustic radiation from said loudspeaker and substantially militate against the sympathetic acoustic interaction between the said enclosure and acoustic apparatus sensitive to outside sound, said diaphragms including inwardly depressed generally planar diffuser ribs which effect the stiffening of said shell and the reflective scattering of sound waves of selected frequency impinging on said diaphragms for militating against the formation of standing waves within the enclosure.

2. The loudspeaker enclosure of claim 1 wherein said shell comprises an integral arrangement of said diaphragm members.

3. The loudspeaker enclosure of claim 1 wherein said loudspeaker mounting baffle is formed from a rigid material which is generally non-oscillatory in response to sound waves emanating from a loudspeaker carried thereby.

4. The loudspeaker enclosure of claim 1 wherein said shell is formed from a low density polyethylene.

5. The loudspeaker enclosure of claim 4 wherein said diaphragm members are of a thickness of approximately 0.120 to 0.180 in.

6. The loudspeaker enclosure of claim 4 wherein said low density polyethylene is shaped into said shell by a rotational molding process.

7. The loudspeaker enclosure of claim 1 wherein the interior of said shell is lined with a high frequency sound absorbing medium.

8. The loudspeaker enclosure of claim 7 wherein said high frequency sound absorbing medium comprises a convoluted foam.

* * * * *